United States Patent [19]

Parrish

[11] Patent Number: 5,084,704
[45] Date of Patent: Jan. 28, 1992

[54] FOCAL PLANE ANALOG-TO-DIGITAL CONVERTER

[75] Inventor: William J. Parrish, Goleta, Calif.

[73] Assignee: Grumman Aerospace Corporation, Bethpage, N.Y.

[21] Appl. No.: 473,742

[22] Filed: Feb. 2, 1990

[51] Int. Cl.⁵ .................. H03M 1/34; H03M 1/52
[52] U.S. Cl. .................................... 341/164; 341/169
[58] Field of Search ............... 341/169, 164, 165, 166, 341/170, 159, 118

[56] References Cited

U.S. PATENT DOCUMENTS

| | | | |
|---|---|---|---|
| 3,479,496 | 11/1969 | Buesch et al. | 341/169 X |
| 3,493,961 | 2/1970 | Hansen | 341/169 X |
| 3,588,876 | 6/1971 | Chatelon et al. | 341/169 |
| 3,668,291 | 6/1972 | Slana | 341/169 X |
| 3,737,897 | 6/1973 | Cuthbert et al. | 341/169 |
| 3,978,472 | 8/1976 | Jones | 341/164 X |
| 4,243,974 | 1/1981 | Mack | 341/164 X |
| 4,528,549 | 7/1985 | Simpson | 341/164 X |
| 4,617,549 | 10/1986 | Reiner | 341/159 X |
| 4,633,086 | 12/1986 | Parrish | 250/338 |
| 4,829,302 | 5/1989 | Oitzl et al. | 341/165 |

OTHER PUBLICATIONS

*Analog-Digital Conversion Handbook*, by the Engineering Staff of Analog Devices, Inc., 1986, pp. 32-33.

Primary Examiner—A. D. Pellinen
Assistant Examiner—Sharon D. Logan
Attorney, Agent, or Firm—Stetina and Brunda

[57] ABSTRACT

An integrated circuit analog-to-digital converter for use on the focal plane of an infrared detector array. The analog-to-digital converter has a sample and hold circuit, a comparator circuit, and a latch circuit. A single slope conversion technique is used to generate digital signals representative of the amplitude of the input analog signal.

15 Claims, 4 Drawing Sheets

FOCAL PLANE ANALOG-TO-DIGITAL CONVERTER

FIELD OF THE INVENTION

The present invention relates generally to analog-to-digital converters and more particularly to an integrated circuit analog-to-digital converter for use on the focal plane of an infrared detector array. The analog-to-digital converter has a sample and hold circuit, a comparator circuit and a latch circuit. A single slope conversion technique is used to generate digital signals representative of the amplitude of the input analog signal.

BACKGROUND OF THE INVENTION

Infrared detection systems for use on satellites incorporate arrays of large numbers of discrete, highly sensitive detector elements, the outputs of which are connected to sophisticated processing circuitry. By rapidly analyzing the pattern and sequence of detector element excitations, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in miniaturization of the detector array and accompanying circuitry, as well as minimization of noise intermixed with the electrical signals generated by the detector elements. Improvements in the reliability and economical production of the detector array and accompanying circuitry are also required.

A contemporary subarray of detectors may, for example, contain 256 detectors on a side, or a total of 65,536 detectors, the size of each square detector being approximately 0.009 centimeters on a side with 0.00127 centimeter spacing between detectors. Such an array would therefore be 2.601 centimeters on a side. The subarray may, in turn be joined to form an array that connects to 25 million detectors or more.

The outputs of the detectors must undergo a series of processing steps in order to permit derivation of the desired information. The more fundamental processing steps include preamplification, tuned bypass filtering, flutter and background rejection, multiplexing and fixed noise pattern suppression. By providing a detector connecting module that performs at least a portion of the signal processing functions within the module, i.e. on integrated circuit chips disposed adjacent the detector focal plane, the signal from each detector need be transmitted only a short distance before processing. As a consequence of such on-focal plane or up-front signal processing, reductions in size, power and cost of the main processor may be achieved. Moreover, up-front signal processing helps alleviate performance, reliability and economic problems associated with the construction of millions of closely spaced conductors connecting each detector element to the main signal processing network.

Contemporary signal processing circuits include an off-focal plane analog-to-digital converter. The power and speed requirements of the analog-to-digital converters for a large detector array are considerable.

The prior art use of a small group of analog-to-digital converters to accommodate the vast number of detector outputs of a large focal plane array dictates the use of multiple pass flash conversion or very high performance successive approximation analog-to-digital converters. Both such techniques are undesirable for satellite applications due to their complexity, weight and power requirements.

As such, although the prior art has recognized to a limited extent the problem of providing analog-to-digital conversion of infrared detector outputs in satellite applications, the proposed solutions have to date been ineffective in providing a satisfactory remedy.

SUMMARY OF THE INVENTION

The present invention comprises an integrated circuit analog-to-digital converter for use on the focal plane of an infrared detector array. The analog-to-digital converter has a sample and hold circuit, a comparator circuit, and a latch circuit. A single slope conversion technique is used to generate digital signals representative of the amplitude of the input analog signal.

In the single slope conversion technique of the present invention a calibrated ramp waveform is compared to the sampled and held output of a detector channel. The time required for the ramp to become greater than the signal is recorded by digitally latching the value of a reference counter at the comparator transition. That is, the reference counter is latched at the point in time when the amplitude of the ramp becomes equal to the amplitude of the sampled detector signal. The time is representative of the detector signal amplitude since the ramp begins synchronously with the counter. The resolution of the conversion process is only limited by the minimum resolvable time increment and comparator noise. The counter and ramp signals are provided globally to the entire focal plane, therefore only a single ramp generator and counter are required. Each individual detector channel requires only a sample and hold, a comparator, and digital latches to perform the analog to digital conversion.

Analog-to-digital conversion on the focal plane provides noise immunity to the detector signals after they leave the focal plane. It also permits the implementation of fiber optic transmission systems to communicate the detector's outputs to the on-board data processor. In addition, gain normalization may be readily incorporated into the analog-to-digital conversion process.

The use of on-focal plane analog-to-digital conversion reduces the amount of analog data that must be transmitted and decreases the computational load of the on-board data processor. This facilitates miniaturization of the detector processing circuitry. The power and speed requirements for analog-to-digital conversion are lower on the focal plane since the task is divided among a large number of very low power converters. The reliability of the system is increased and the cost of constructing it is decreased due to the reduction in processing circuitry and electrical interconnections.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

The analog-to-digital converter of the present invention is illustrated in FIGS. 1 through 8 of the drawings which depict a presently preferred embodiment of the invention. The disclosed analog-to-digital converter has a dynamic range of 15 bits with drift less than ±1 LSB for each LSB of time measured by the single slope process. Power dissipation is less than 0.5 W per channel. Each 15 bit converter requires 58K$^2$ of wafer surface.

Figure 1:
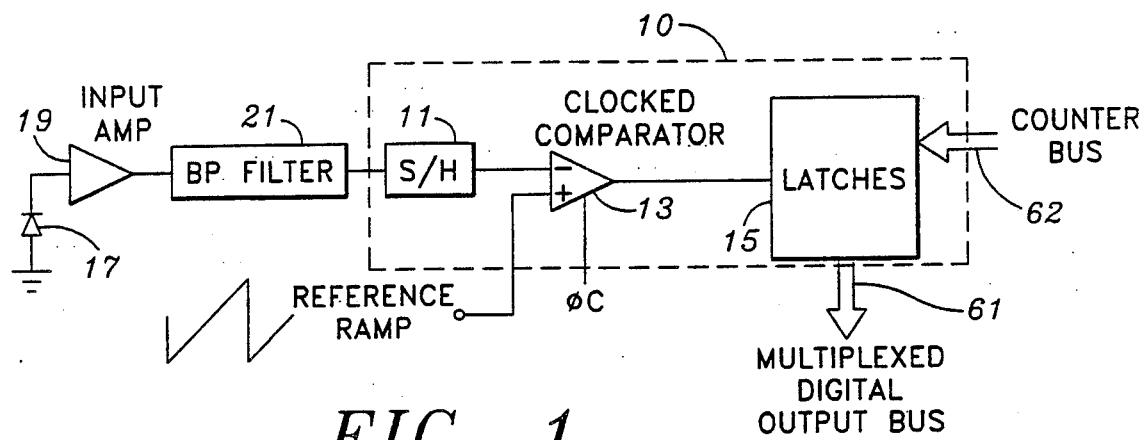
FIG. 1 is a block diagram of the analog-to-digital converter of the present invention.

Referring now to FIG. 1, the analog-to-digital converter 10 is comprised of a sample and hold 11, a clocked comparator 13 and latches 15. The signal from an infrared detector 17 is amplified by an input amplifier 19 after which it typically passes through a band pass filter 21. The amplified and filtered infrared detector signal then passes into the analog-to-digital converter 10. The sample and hold isolates the input analog detector signal and stores it for use by the clocked comparator 13. The clocked comparator 13 compares the stored detector signal in the sample and hold 11 to an increasing reference ramp signal and provides an output to the latch 15 when the amplitude of the reference ramp signal is at a fixed potential relative to the amplitude of the stored detector signal. This is more fully explained in reference to FIG. 2 below.

The latches 15 are responsive to the output signal of the clocked comparator 13. A counter bus 62 provides counter signals to the latches 15. The counter signals provide a measurement of the amount of time required for the ramp to achieve a fixed potential relative to the level of the detector signal stored in the sample and hold 11. The counter commences counting when the ramp begins to increase and ceases counting when the ramp is equal to or at a fixed potential relative to the detector signal. The output from the clocked comparator 13 causes the latches 15 to store the value of the counter at the time when the level of the reference ramp achieves a fixed potential relative to the level of the stored detector signal. A clock signal C enables the input to the clocked comparator only when a stable counter signal is available to the latches 15 to insure that the correct count is stored by the latches 15. The latches 15 are thereby prevented from attempting to latch a counter signal while the counter signal is changing state.

The latches 15 output onto the output bus 61 a multiplexed digital signal representative of the time required for the reference ramp to achieve a fixed potential relative to the detector signal. This time is proportional to and representative of the amplitude of the infrared detector signal stored in the sample and hold 11.

Figure 2:
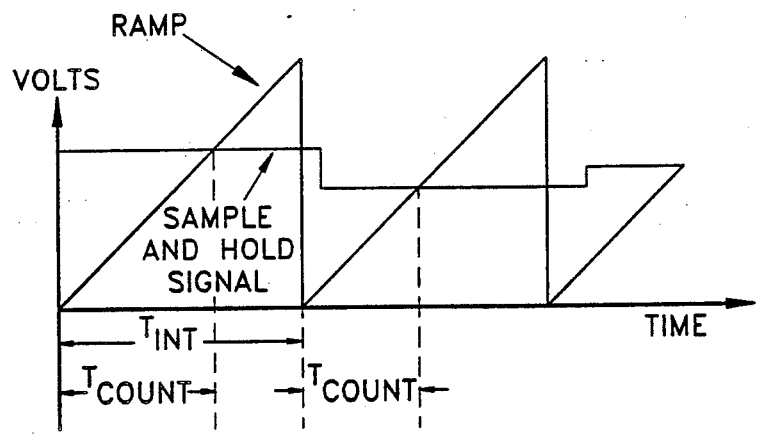
FIG. 2 is a graphical representation of the ramp and detector signal.

Referring now to FIG. 2 the comparative levels of the reference ramp and the sample and hold detector signal are depicted. As can be seen from the illustrated waveforms, the ramp continues increasing in amplitude for a time interval equal to $T_{INT}$. During this period, at a time equal to $T_{COUNT}$, the level of the ramp equals the level of the sample and hold detector signal. The time $T_{count}$ required for the ramp to equal the level of the sample and hold signal is proportional to the amplitude of the sample and hold signal. Therefore, each interval $T_{COUNT}$ provides an indirect measurement of the amplitude of the detector signal stored in the sample and hold.

It can be seen in FIG. 2 that the amplitude of the sample and hold signal is greater during the interval of the first ramp than during the interval of the second ramp. The time interval $T_{COUNT}$ for the first ramp is correspondingly longer that the time interval $T_{COUNT}$ for the second ramp. This demonstrates the fact that the time interval $T_{COUNT}$ is proportional to the amplitude of the sample and hold signal.

The clocked comparator 13 does not necessarily provide an output to the latches 15 at the precise instant that the level of the ramp is equal to the level of the detector signal. There is, in fact, no need for such precision. The clocked comparator 13 outputs a signal to the latches 15 when the reference ramp is at a fixed potential relative to the detector signal. This fixed potential may place the ramp at an amplitude greater than, less than, or equal to the amplitude of the detector signal, but whatever the relationship, it will always be the same. The amount by which the amplitude of the reference ramp differs from the amplitude of the detector signal when the clocked comparator 13 outputs a signal to the latches 15 is fixed and does not vary. Consequently, the time interval $T_{COUNT}$ is representative of the amplitude of the detector signal.

The clocked comparator 13 determines the point in time at which the reference ramp is at a fixed potential relative to the sampled and held detector signal, thus determining $T_{COUNT}$. The latches 15 store the time $T_{COUNT}$ and provide a digital output proportional to and representative of the level of the stored detector signal.

Figure 3:
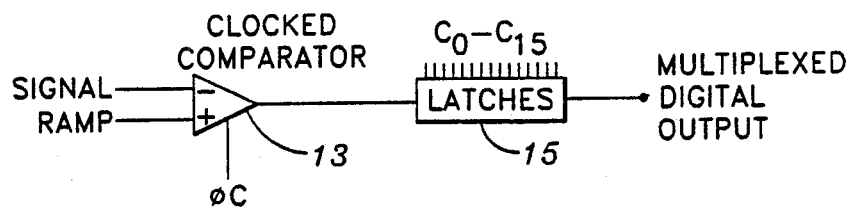
FIG. 3 is a block diagram illustrating the inputs to the latches associated with a single detector channel.

Referring now to FIG. 3, the inputs to the latches 15 and the output of latches 15 are illustrated. In the preferred embodiment of the present invention 15 counters $C_0$–$C_{15}$ are used to provide 15 bits of resolution. A separate latch circuit is used for each bit of resolution required. A separate counter signal $C_0$–$C_{15}$ is applied to each latch. Counter signal $C_0$ has a period equal to the longest time required to be measured. Counter signal $C_1$ has a period equal to one half the period of $C_0$. Each succeeding counter signal $C_3$–$C_{15}$ has a period equal to one half that of the preceding counter signal.

All counters $C_0$–$C_{15}$ begin in a given (e.g. low) state and start to count when the ramp begins to rise. The state of the counters is therefore representative of the duration for which the ramp has been increasing. For example, assuming all counters are initialized in a low state, if the counters are latched at the instant after they have run for three quarters of their maximum duration, then $C_0$ will be high, $C_1$ will be high, and $C_2$-$C_{15}$ will be low. This is because $C_0$ indicates that one half of the maximum duration had transpired and $C_1$ indicates that one quarter more of the maximum duration had transpired. After the counters are latched, their values are multiplexed and output over the output bus 61 as serial digital data.

Figure 4:
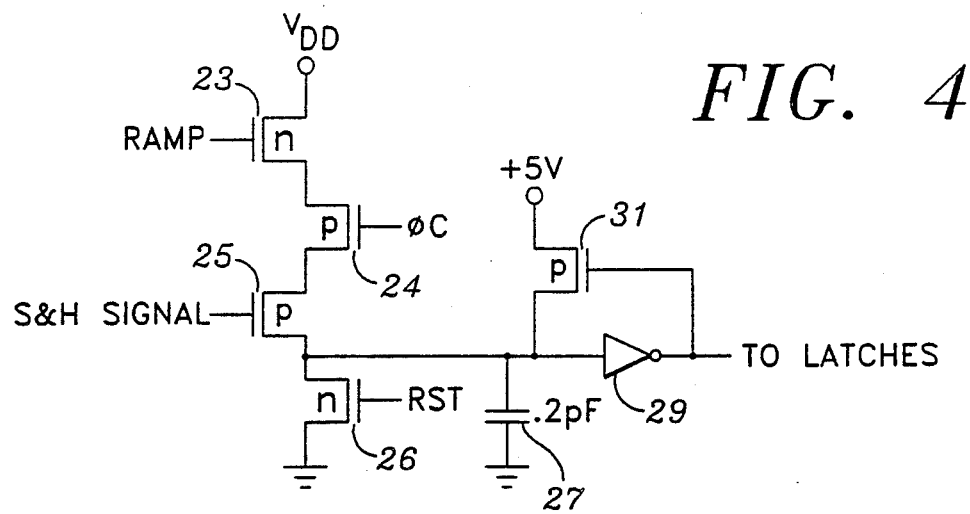
FIG. 4 is a schematic diagram of the comparator circuit.

Referring now to FIG. 4, the clocked comparator has a first transistor 23 responsive to the ramp signal. Connected in series to the first transistor 23 is a second transistor 25, responsive to the sampled output of the infrared detector 17 stored in the sample and hold 11. Connected in series with the first 23 and second 25 transistors is a third transistor 24, responsive to a clock signal such that continuity through the three transistors is only achieved during that period of time when the clock signal C is present on third transistor 24. A clock signal C is only present on third transistor 24 when the counter signals $C_0$-$C_{15}$ are stable on the latches 15. Transistors 23 and 25 cooperate such that the sample and hold signal applied to transistor 25 establishes a threshold which must be exceeded by the ramp signal applied to transistor 23 for both transistors to conduct. Activation of transistors 23 and 25 may not occur at the precise instant when the ramp becomes equal in amplitude to the detector signal stored in the sample and hold. However, conduction of transistors 23 and 25 will occur when the ramp signal is at a fixed potential relative to the detector signal stored by the sample and hold. Therefore, the point at which conduction occurs is representative of the amplitude of the stored detector signal.

A fourth transistor 26 in the comparator circuit, is responsive to an external reset RST signal which resets the comparator and puts it in a condition to receive and respond to another input detector signal.

First transistor 23 and second transistor 25 will cooperate to charge capacitor 27 when the reference ramp is a fixed potential above the input signal level. Capacitor 27 stores a charge when current is permitted to flow through first, second and third transistors 23, 25 and 24, respectively. When the charge on capacitor 27 reaches a sufficient level it causes invertor 29 to output a low state. The output of invertor 29 is fed back to a fifth transistor 31 which then connects the input of the invertor 29 to the plus 5 volt logic level to sustain the state of invertor 29 and thereby hold its output at a low level. The reset RST signal shorts capacitor 27 to ground when it causes transistor 26 to conduct.

Figure 5:
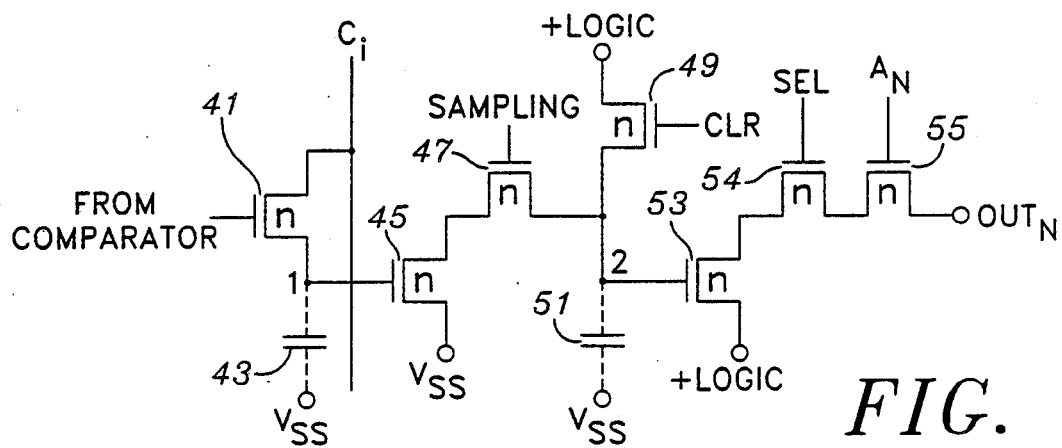
FIG. 5 is a schematic diagram of the latch circuit.

Referring now to FIG. 5 a representative one of the latches 15 of FIG. 1 is depicted. The latch has a first transistor 41 which is responsive to the output of the comparator 13.

As described above, a plurality of such latch circuits are used to measure the time $T_{COUNT}$ which it takes for the reference ramp signal to achieve a fixed potential relative to the sample and hold signal from the infrared detector. Each of the counters $C_0$-$C_{15}$ are connected to a dedicated latch at $C_i$. A first capacitor 43 is connected to counter $C'$ by first transistor 41. The capacitor 43 is isolated from counter C when the output of the clocked comparator 13 transitions from the high state to the low state, thereby causing first transistor 41 to become non-conductive. Isolating first capacitor 43 from counter $C_i$ traps the state of counter $C_i$ on the first capacitor 43. Trapping the state of each counter signal $C_0$-$C_{15}$ on a separate latch provides a digital representation of the interval $T_{COUNT}$ required for the ramp to reach the level of the sample and hold signal.

Connected to node 2 is the gate of a second transistor 45 which is responsive to the presence of a charge on first capacitor 43. In series with the second transistor 45 is a third transistor 47 which is responsive to a SAMPLING signal. The drain of third transistor 47 is connected to the source of a fourth transistor 49 which is responsive to an external clear CLR signal, used to place a preset charge on a second capacitor 51.

Also connected to node 2 is the gate of fifth transistor 53 which is responsive to the charge stored on second capacitor 51. Sixth and seventh transistors 54 and 55 are connected in series with fifth transistor 53 and cooperate to permit the status (on/off) of fifth transistor 53 to be read as the output $OUT_N$. The output $OUT_N$ can only be read when sixth and seventh transistors 54 and 55 are conducting. The status of fifth transistor 53 defines the output $OUT_N$ of the latch. To provide 15 bit resolution, fifteen latches are used. The outputs of these fifteen latches define the digital signal representative of the amplitude of the detector signal.

Second capacitor 51 is initially preset high by applying a CLR pulse to fourth transistor 49. This connects second capacitor 51 to the +LOGIC level, thereby presetting second capacitor 51 high. A high state in second capacitor 51 causes fifth transistor 53 to conduct.

The charge on second capacitor 51 will either be left high or pulled low depending upon the presence or absence of a high state on first capacitor 43 when a SAMPLE pulse is received by third transistor 47.

A high state on first capacitor 43 will activate second transistor 45. The SAMPLING pulse will then cause the charge on capacitor 51 to bleed off to $V_{SS}$ through second and third transistors 45 and 47, thereby placing a low state on the gate of fifth transistor 53.

A low state on first capacitor 43 will not activate second transistor 45. The SAMPLING pulse will then have no effect upon the preset charge on capacitor 51 since it cannot bleed off through non-conducting second transistor 45. A high state will be maintained upon fifth transistor 53.

The state of fifth transistor 53, and therefore the output of the latch is read by activating sixth and seventh transistors 53 and 55 with positive pulses SEL and $A_n$ respectively. These pulses place the output of the latch upon the output bus 61 over which it may be transmitted.

Figure 6:
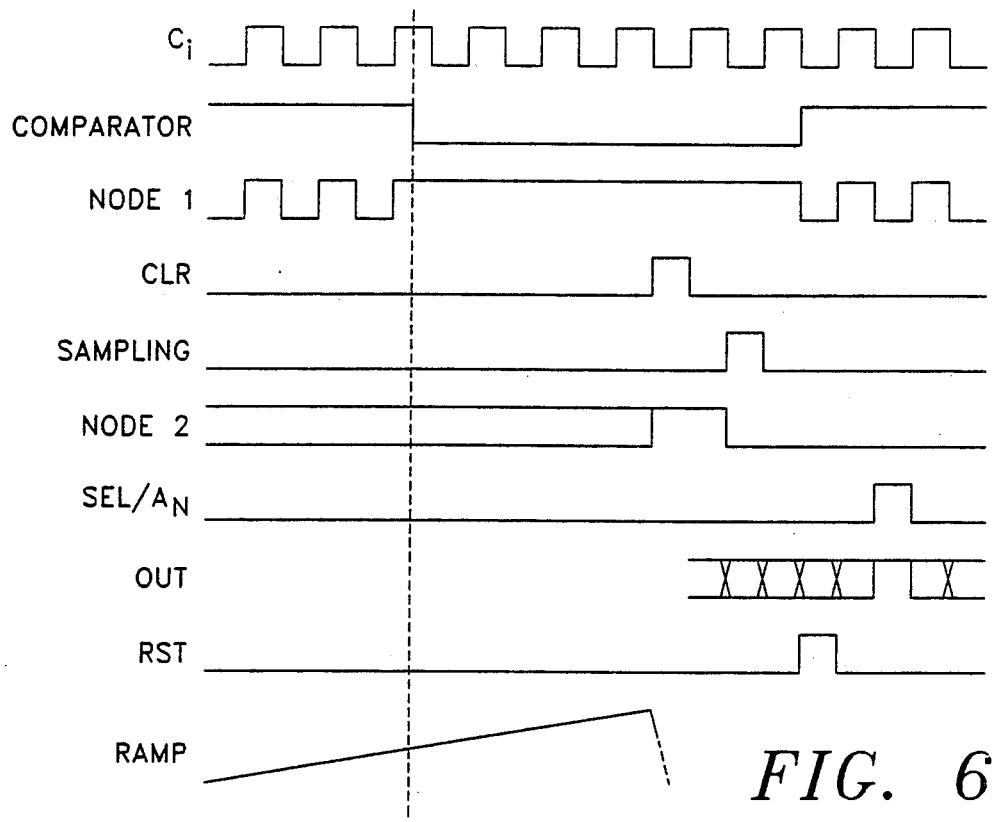
FIG. 6 is a timing diagram of the waveforms at various points in the converter and latch circuits.

Referring now to FIG. 6, a timing diagram of the counter, comparator, control signals, node waveforms, ramp and output are shown for a single latch. The counter signal C is a clock signal of a specific duration whose period depends upon the longest time $T_{int}$ to be measured and upon which signal ($C_0$-$C_{15}$) it is. The counter signal $C_0$ will be the counter signal of the longest period and the counter signal $C_{15}$ will be the counter signal of the shortest period, as discussed above.

The comparator output shown transitions from a high state to a low state at the dashed vertical line indicating the point in time at which the ramp signal is at a fixed potential relative to the detector signal stored in the sample and hold. This transition occurs because at this point in time the ramp signal applied to first comparator transistor 23 of FIG. 4 is a fixed potential in relation to the sample and hold signal applied to comparator second transistor 25. At this point in time clock signal C is applied to comparator third transistor 24 thereby completing the path between VDD and capacitor 27. A positive charge is accumulated upon capacitor 27 sufficient to activate invertor 29. Invertor 29 outputs a low state which turns on P channel enhancement mode FET 31, applying +5 volts to the input of invertor 29 and latching the output of the latch circuit in a low state. Therefore, the comparator signal of FIG. 6 remains in a low state until the reset RST signal is received by comparator fourth transistor 26.

The waveform shown for node 1 illustrates the state of latch first capacitor 43. The state at node 1 will be the state of counter $C_i$ as long as latch first transistor 41 is conducting. The transition of the clocked comparator 13 output from a high state to a low state at the time indicated in FIG. 6 by the dashed vertical line causes the latch first transistor 41 to cease conducting. This isolates the state of the counter $C_i$ on latch first capacitor 43 at the time of the transition. This is a high state as depicted in FIG. 6 where the waveform of node 1 at the time of the transition is high. The state of node 2 remains high until the reset RST pulse, also shown in FIG. 6, is issued. Node 1 then resumes following counter $C_i$ since the RST pulse causes latch first transistor 41 to resume conducting. Latch first transistor 41 resumes conducting because the clocked comparator 13 is likewise reset by the RST pulse.

The clear CLR pulse is issued prior to the SEL and $A_N$ pulses to place a preset charge on latch second capacitor 51. After the preset charge has been placed upon latch second capacitor 51 a SAMPLING pulse is issued to latch third transistor 47 enabling the preset charge stored upon latch second capacitor 51 to either remain or bleed off depending upon the state of latch second transistor 45.

The state at node 2 as depicted by the waveform in FIG. 6 will be either high or low prior to latch fourth transistor 49 receiving the clear CLR pulse, depending upon whether or not the preset charge stored upon capacitor 5 had been bled to a low state during the previous read cycle. After the issuance of the clear pulse to latch fourth transistor 49 the state at node 2 will become high and remain there at least until the SAMPLING pulse is issued. Thereafter the state of node 2 will either remain high or be bled to a low state depending upon the state of latch second transistor 45. As depicted in FIG. 6, node 2 is bled to a low state when the SAMPLING pulse is issued, indicating that a high state has been stored on latch first capacitor 43, as is shown by the waveform of node 1.

The select SEL and address $A_N$ pulses are issued after the SAMPLING pulse has been issued, thereby enabling the output of the latch to be read. The select SEL and address $A_n$ pulses are identical positive pulses issued at the point in time to the latch being addressed. They are therefore depicted in FIG. 6 as a single waveform.

The address pulses $A_n$ determines which of a group of latches is to be read. Each group of latches corresponds to an individual detector element channel. The select SEL pulse enables a specific latch within the group so that the output of that latch can be multiplexed onto the digital output bus shown in FIG. 1. The focal plane analog-to-digital converter of the present invention has 15 bits of resolution, therefore 15 latches are required for each detector channel. The output of each of the 15 latches, when output onto the digital output bus 61, defines a signal representative of the amplitude of the detector signal stored in the sample and hold 11.

The output of the latch as shown in FIG. 6 has a high state during the period when the select SEL and address AN pulses are issued. The activation of latch second transistor 53 caused by the high state on latch second capacitor 51 results in a positive output pulse during the period when the select SEL and address AN pulses are issued. The +logic level is applied to the output OUT since latch fifth, sixth, and seventh transistors 53, 54 and 55 respectively, are conducting.

The use of a double buffered latch circuit as depicted in FIG. 5 permits the state of the counter line $C_i$ to be trapped by the first latch capacitor 22 while the second latch capacitor 51 holds a state representative of the previous state of counter line $C_i$ for readout. Therefore, a readout can occur while a subsequent conversion sequence is taking place simultaneously.

The digitized output of the latches is multiplexed onto a serial output bus 61 to obtain a low power, noise immune link to the on-board data processor.

Figure 7:
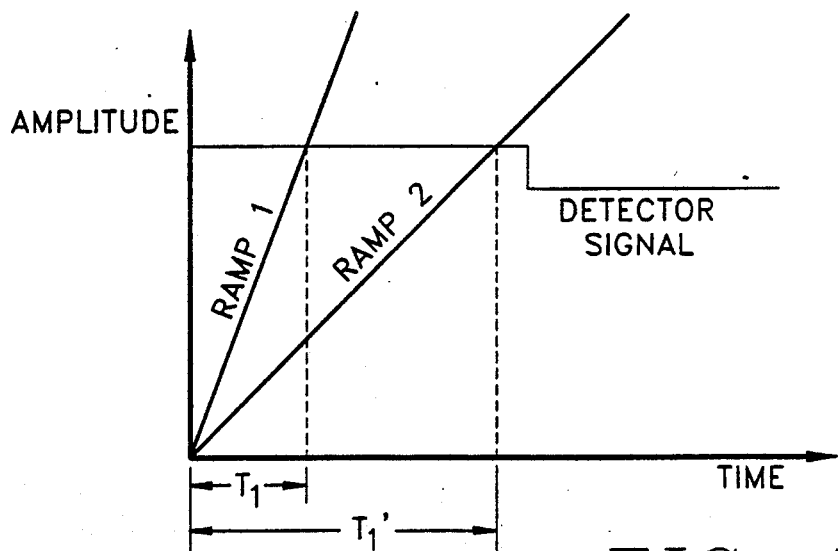
FIG. 7 is a graphical representation of the ramp and detector input signal illustrating the effect of using a ramp having a lesser slope and a ramp having a greater slope.

Referring now to FIG. 7, the slope of the reference ramp signal can be varied to change the gain of the focal plane analog-to-digital converter. The greater the slope of the reference ramp signal the lower the gain of the focal plane analog-to-digital converter will be and the less the slope of the reference ramp signal the greater the gain will be. This is because a ramp with a greater slope, such as Ramp 1 intersects the detector signal earlier, resulting in the shorter time T1 which is representative of the amplitude of the detector signal. A ramp having a lesser slope, such as Ramp 2 requires more time to intersect the detector signal, therefore resulting in a greater period of time T1' which is likewise representative of the detector signal amplitude. Therefore, the gain of the focal plane analog-to-digital converter can be varied by changing the slope of the reference ramp. This can be done on a real time basis, wherein the slope of the reference ramp for each detector channel can be independently varied to provide gain normalization among detector channels. This is one means of insuring that all detector channels have the same output when provided with given identical inputs.

Figure 8:
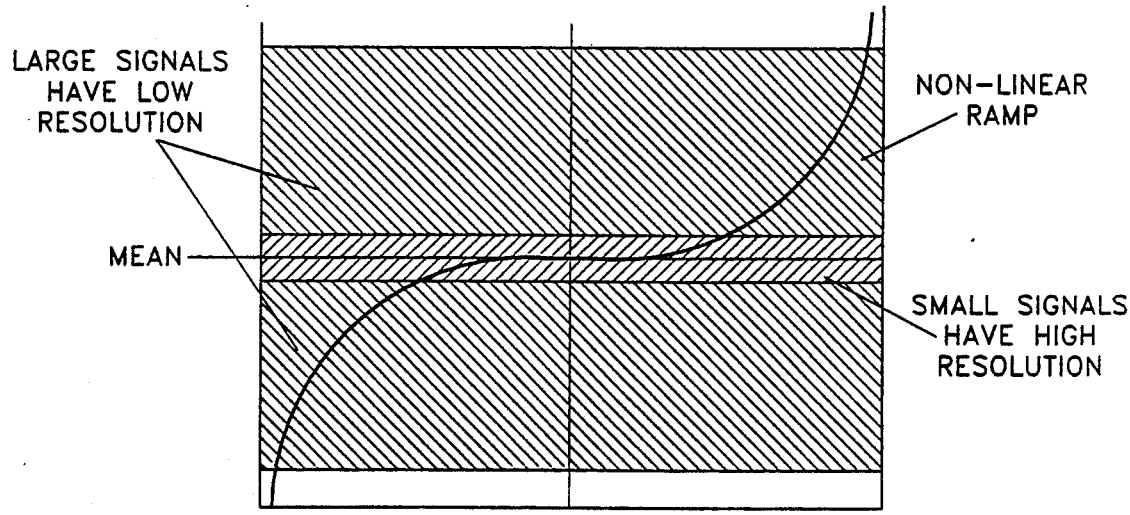
FIG. 8 is a graphical representation of the effects of using a non-linear ramp to achieve compression for improved dynamic range and FIG. 9 is a block diagram of a plurality of analog-to-digital converter.

Referring now to FIG. 8, nonlinear conversion can be accomplished with a curved reference ramp such as that depicted. This results in compression of detector signals having a large deviation from the mean level. The use of compression provides maximum dynamic range. It maintains high resolution on smaller signals by sacrificing resolution on higher amplitude signals where resolution is less critical. By using a nonlinear ramp such as that depicted in FIG. 8 signals having a large deviation from the mean will intersect a portion of the reference ramp having a greater slope and thereby be compressed since the associated time, which is representative of the detector signal amplitude, will be shortened. Signals having a lower deviation from the mean will intersect the nonlinear ramp near its center where the slope is lowest. This results in lower level signals being represented by time periods of comparatively greater duration. Representing smaller signals with time periods of comparatively greater duration permits greater resolution in their representation.

As illustrated in FIGS. 7 and 8, the reference ramps can be tailored to accommodate the specific output characteristics of individual detector elements. This permits detector elements having a wide range of electrical characteristics to be interfaced to signal processing equipment having a limited dynamic range. The slope of the ramp can be varied real time for each individual detector channel to provide gain normalization. The shape of the non-linear ramp can be varied real time for each individual channel to provide variable compression.

Figure 9:
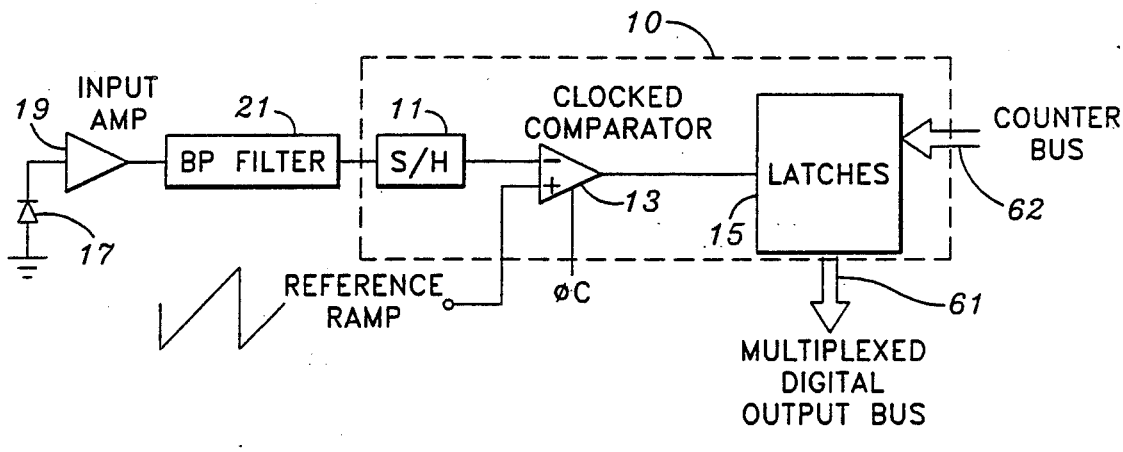
Figure 9:
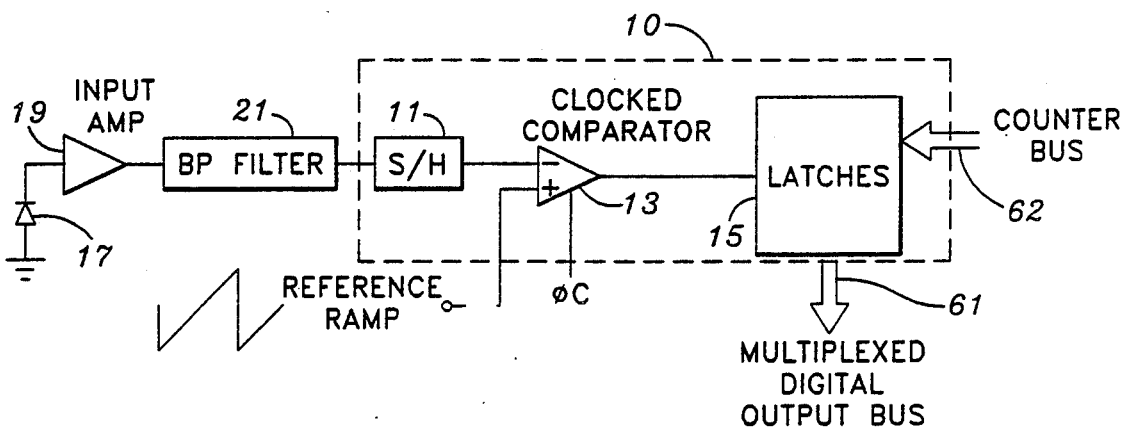

Referring now to FIG. 9, a plurality of analog-to-digital converters of the present invention are illustrated as indicated by the ellipsis. In practice, a plurality of such channels of analog-to-digital conversion are necessary to accommodate the large number of detectors commonly associated with contemporary detector subarrays.

It is understood that the exemplary focal plane analog-to-digital converter described herein and shown in the drawings represents only a presently preferred embodiment of the invention. Indeed, various modifications and additions may be made to such embodiment without departing from the spirit and scope of the invention. For example, transistors other than FETs may be used. Various arrangements of enhancement mode and depletion mode FETs are possible. Also, other arrangements of the electrical components involving different physical placements may be functionally identical. For example, transistors 23 and 24 can be reversed in position without affecting the function of the circuit. Thus, these and other modifications and additions may be obvious to those skilled in the art and may be implemented to adapt the present invention for use in a variety of applications.

What is claimed is:

1. A focal plane analog-to-digital converter for providing noise immune data communications between a detector element on the focal plane of an infrared detector array and a remote processor, the detector element providing an output signal, the analog-to-digital converter receiving externally generated signals including a ramp signal, counter signals, and a clock signal, the analog-to-digital converter comprising:
    (a) a sample and hold circuit for receiving and storing the output of one dedicated detector element;
    (b) a comparator responsive to said sample and hold circuit for comparing the amplitude of the stored detector signal to the amplitude of the externally generated ramp signal, said comparator further being responsive to the externally generated clock signal, said clock signal enabling said comparator only when the counter signals are stable to prevent an output from said comparator during counter signal changes of state;
    (c) a plurality of latches, the number of latches corresponding to the desired resolution of the analog-to-digital process, for latching the value of the externally generated counter signals when the amplitude of the ramp signal is at a fixed potential relative to the amplitude of the detector signal stored in the sample and hold circuit; and
    (d) wherein said sample and hold circuit, said comparator, and said latches are disposed upon the focal plane of an infrared detector array.

2. The focal plane analog-to-digital converter as recited in claim 1 wherein said comparator comprises:
    (a) a first transistor, responsive to the externally generated ramp signal;
    (b) a second transistor in series with said first transistor, responsive to the output of the sample and hold circuit;
    (c) a capacitor in series with said second transistor, said capacitor accumulating a charge when said first transistor and said second transistor conduct;
    (d) wherein said first transistor and said second transistor both conduct when the externally generated ramp signal is at a fixed potential relative to the output of said sample and hold circuit; and
    (e) wherein the charge accumulated upon said capacitor provides a signal indicating that the externally generated ramp signal is at a fixed potential relative to the output of said sample and hold circuit.

3. The focal plane analog-to-digital converter as recited in claim 2 further comprising a third transistor in series with said first and second transistors responsive to the externally generated clock signal such that said capacitor can only accumulated a charge during the period of time when the externally generated clock signals are stable.

4. The focal plane analog-to-digital converter as recited in claim 3 further comprising:
    (a) an invertor responsive to the charge accumulated upon said capacitor;
    (b) a fourth transistor responsive to the output of said invertor; and
    (c) wherein said invertor and said fourth transistor cooperate to maintain the output of said comparator at a given state once a charge has accumulated upon said capacitor to insure the stability of the comparator.

5. The focal plane analog-to-digital converter as recited in claim 4 wherein said latches are double buffered to permit the output of the latches to be read while a subsequent conversion is occurring simultaneously.

6. The focal plane analog-to-digital converter as recited in claim 5 wherein each of said latches further comprises:
    (a) a first capacitor for storing a charge representative of the state of one externally generated counter signal;
    (b) a second capacitor for storing a preset charge;
    (c) a first transistor responsive to the charge stored upon said first capacitor, said first transistor discharging said second capacitor when said first transistor conducts; and
    (d) wherein said first capacitor stores the state of one counter signal while the state of said second capacitor is being used to define the output of the latch.

7. The focal plane analog-to-digital converter as recited in claim 6 wherein the slope of the ramp signal can be varied to change the gain of the analog-to-digital converter.

8. The focal plane analog-to-digital converter as recited in claim 7 wherein the slope of the ramp can be varied in real time for each individual detector channel to provide gain normalization.

9. The focal plane analog-to-digital converter as recited in claim 1 wherein said comparator is responsive to the slope of the ramp signal to change the gain of the analog-to-digital converter.

10. The focal plane analog-to-digital converter as recited in claim 1 wherein said comparator is responsive to the slope of successive ramp signals such that successive analog-to-digital conversion may be performed at different gains.

11. A method for analog-to-digital conversion comprising the steps of:
    (a) storing the sampled output of an infrared detector in a sample and hold circuit;

(b) providing an output from a comparator connected to the sample and hold circuit when the amplitude of a ramp signal is at a fixed potential relative to the sampled output amplitude of the detector and when a clock signal indicates that a counter is stable to insure that a valid count is received; and (c) storing the state of the counter, representative of the time for which it takes the ramp signal to increase in amplitude to a level where the ramp signal is at a fixed potential relative to the sampled output of the infrared detector, in response to the comparator output.

12. The method as recited in claim 11 wherein the step of providing an output from a comparator further comprises the steps of:

(a) communicating a ramp signal to a first transistor;

(b) communicating the detector signal from the sample and hold circuit to a second transistor which is in series with the first transistor;

(c) accumulating a charge upon a capacitor when both the first and second transistor conduct once the ramp signal has increased to a level where it is at a fixed potential relative to the level of the sample and hold circuit output; and (d) storing the state of the counter when a charge has accumulated upon the capacitor, the state of the counter being representative of the amplitude of the detector signal.

13. The method as recited in claim 11 wherein the step of accumulating a change upon a capacitor utilized a variable slope ramp, the slope being variable between successive analog-to-digital conversion operations such that the gain of the analog-to-digital converter may be varied between successive operations.

14. The method as recited in claim 11 wherein the step of accumulating a charge upon a capacitor utilizes a variable slope ramp to permit the gain of the analog-to-digital circuit to be varied.

15. A focal plane analog-to-digital converter for providing noise immune data communications between detector elements on the focal plane of an infrared detector array and a remote processor, the detector element providing an output signal, the analog-to-digital converter receiving an externally generated ramp signal, counter signals, and a clock signal, the analog-to-digital converter comprising:

(a) a plurality of sample and hold circuits, the number of sample and hold circuits substantially conforming to the number of detector elements, each sample and hold circuit for receiving and storing the output signal of one dedicated detector element;

(b) a comparator responsive to each sample and hold circuit for comparing the amplitude of the stored detector signal to the amplitude of the externally generated ramp signal, said comparator further being responsive to the externally generated clock signal, said clock signal enabling said comparator only when the counter signals are stable to prevent an output from said comparator during counter signal changes of state;

(c) a plurality of latches, the number of latches corresponding to the desired resolution of the analog-to-digital process, for latching the value of the externally generating counter signals when the amplitude of the ramp signal is at a fixed potential relative to the amplitude of the detector signal stored in the sample and hold circuit; and (d) wherein said sample and hold circuit, said comparator, and said latches are disposed upon the focal plane of an infrared detector array.

* * * * *